(12) United States Patent
Kanda et al.

(10) Patent No.: US 7,291,883 B2
(45) Date of Patent: Nov. 6, 2007

(54) SEMICONDUCTOR DEVICE

(75) Inventors: Ryo Kanda, Gunma (JP); Shuichi Kikuchi, Gunma (JP); Seiji Otake, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 68 days.

(21) Appl. No.: 11/360,286

(22) Filed: Feb. 22, 2006

(65) Prior Publication Data
US 2006/0186477 A1  Aug. 24, 2006

(30) Foreign Application Priority Data
Feb. 24, 2005  (JP)  ............... P2005-049007

(51) Int. Cl.
*H01L 29/792* (2006.01)
(52) U.S. Cl. ...................... 257/328; 257/356
(58) Field of Classification Search ............... 257/356, 257/328
See application file for complete search history.

(56) References Cited

U.S. PATENT DOCUMENTS

2004/0201061 A1* 10/2004 Jeon et al. .................. 257/335
2004/0238913 A1* 12/2004 Kwon et al. ................ 257/492

FOREIGN PATENT DOCUMENTS

JP    10-506503    6/1998

* cited by examiner

*Primary Examiner*—Sara Crane
(74) *Attorney, Agent, or Firm*—Fish & Richardson P.C.

(57) ABSTRACT

In a conventional semiconductor device, there is a problem that an N-type diffusion region provided for protecting an element from an overvoltage is narrow and a breakdown current is concentrated so that a PN junction region for protection is broken. In a semiconductor device of the present invention, an N-type buried diffusion layer is formed across a substrate and an epitaxial layer. A P-type buried diffusion layer is formed across a wider region on an upper surface of the N-type buried diffusion layer so that a PN junction region for overvoltage protection is formed. A P-type diffusion layer is formed so as to be connected to the P-type diffusion layer. A breakdown voltage of the PN junction region is lower than a breakdown voltage between a source and a drain. With this structure, the concentration of the breakdown current is prevented so that the semiconductor device can be protected from the overvoltage.

3 Claims, 8 Drawing Sheets

— Having overvoltage protection structure
----- Having no overvoltage protection structure

SEMICONDUCTOR DEVICE

Priority is claimed to Japanese Patent Application Number JP2005-049007 filed on Feb. 24, 2005, the disclosure of which is incorporated herein by reference in its entirety.

BACKGROUND OF THE INVENTION

1. Field of the Invention

The present invention relates to a semiconductor device for protecting a circuit element from an overvoltage.

2. Description of the Related Art

In conventional semiconductor devices, for example, an N-type epitaxial layer is deposited on a P-type semiconductor substrate in order to form an N-channel LDMOS transistor. A P-type diffusion region, which is used as a back gate region, is formed on the epitaxial layer. An N-type diffusion region, which is used as a source region, is formed on the P-type diffusion layer. Moreover, an N-type diffusion layer, which is used as a drain region, is formed on the epitaxial layer. Then, an N-type buried region, which is placed below the drain region, is formed across the semiconductor substrate and the epitaxial layer. At this time, a breakdown voltage of a PN junction region, which is formed of the buried region and the semiconductor substrate, is set to be lower than a breakdown voltage between the source and the drain of the LDMOS transistor. Even when an overvoltage by which the LDMOS transistor is destroyed is applied to a drain electrode, the PN junction formed of the buried region and the semiconductor substrate breaks down by this structure. As a result, it is possible to prevent the LDMOS transistor from being destroyed by the overvoltage. This technology is described in Published Japanese Patent Translations of PCT International Publications for Patent Applications No. 10-506503 (pages 4 to 5, 7, and FIGS. 1 to 2).

As mentioned above, in the conventional semiconductor devices, the N type buried region is formed below the drain region in order to prevent the LDMOS transistor from being destroyed by the overvoltage applied to the drain region. The N-type buried region is formed to have substantially an equal width to that of the drain region. This structure causes a breakdown current to concentrate on the PN junction region of the N-type buried region and the P-type semiconductor substrate when the overvoltage is applied to the drain region and the PN junction breaks down. This leads to a problem in which the PN junction region is destroyed by a current concentration and heat caused by the concentration.

Moreover, in the conventional semiconductor device, the N-type buried region is formed in a wide range in order to make it possible to prevent the current concentration on the PN junction region. The conventional semiconductor devices here aim to improve a withstand voltage characteristic using a known RESURF principle. For this reason, the N-type buried region is largely formed so as to extend to an isolation region. While, the N-type buried region is formed additionally in the LDMOS transistor in order to form the PN junction region. Namely, when the N-type buried region is formed in the wide range, a space between the drain region and the isolation region is increased to expand an ineffective region where no element is formed. This causes a problem in which an element forming region cannot be efficiently formed with respect to a chip size.

Furthermore, in the conventional semiconductor devices, the P-type semiconductor substrate is used and the PN junction region is formed of the N-type buried region and the P-type semiconductor substrate. This structure causes overvoltage to be applied to the drain region, so that a generating breakdown current flows to the semiconductor substrate. Accordingly, for example, the breakdown current flows thereto, thereby an electric potential of the semiconductor substrate set in a ground state is increased. In other words, since the semiconductor substrate is used as a flow path for the breakdown current, there are problems in which other elements formed on the same substrate cause an erroneous operation by the increase in the substrate potential and a latch-up phenomenon occurs.

SUMMARY OF THE INVENTION

Accordingly, the present invention has been made in view of the foregoing. A semiconductor device according to preferred embodiments of the present invention includes a semiconductor substrate of one conductivity type, an epitaxial layer of an opposite conductivity type formed on the semiconductor substrate, a buried diffusion layer of an opposite conductivity type formed across the semiconductor substrate and the epitaxial layer, a buried diffusion layer of one conductivity type formed on the buried diffusion layer of the opposite conductivity type and has a first junction region with the buried diffusion layer of the opposite conductivity type, a first diffusion layer of one conductivity type formed on the epitaxial layer and used as a drain region, a first diffusion layer of an opposite conductivity type formed on the first diffusion layer of the one conductivity type which is used as a back gate region and has a second junction region with the first diffusion layer of the opposite conductivity type, a second diffusion layer of one conductivity type formed on the first diffusion layer of the opposite conductivity type and used as a source region, a gate oxide film and a gate electrode formed on the epitaxial layer, and a second diffusion layer of an opposite conductivity type formed in the epitaxial layer and electrically connected to the second diffusion layer of the one conductivity type above the epitaxial layer, and a breakdown voltage of the first junction region is lower than a breakdown voltage of the second junction region. Accordingly, in the preferred embodiments of the present invention, when an overvoltage is applied to the diffusion layer used as the source region, the first junction region is broken down before the second junction region is broken down. With this structure, it is possible to prevent the semiconductor device from being broken by applying the overvoltage.

In addition, in the semiconductor device according to the preferred embodiments of the present invention, the first diffusion layer of the one conductivity type is connected to the buried diffusion layer of the one conductivity type. Therefore, in the preferred embodiments of the present invention, the first diffusion layer of the one conductivity type used as the drain region is connected to the buried diffusion layer of the one conductivity type. With this structure, a drain voltage can be applied to the buried diffusion layer of the one conductivity type so that an element size can be minimized. In addition, a deterioration of an element characteristic can be prevented by spacing apart a current path for a breakdown current and a current path for a semiconductor element.

Moreover, the semiconductor device according to the preferred embodiments of the present invention includes a third diffusion layer of one conductivity type used as a drain lead-out region that is formed in the first diffusion layer of the one conductivity type and the third diffusion layer of the one conductivity type and the first diffusion layer of the opposite conductivity type is alternately and repeatedly disposed in the first diffusion layer of the one conductivity type. Therefore, in the preferred embodiments of the present invention, even in a configuration in which the third diffusion layer of the one conductivity type as the drain region and the first diffusion layer of the opposite conductivity type as a back gate region on which a source region is formed are alternately and repeatedly disposed, a breakdown of the semiconductor device due to the overvoltage can be prevented.

BRIEF DESCRIPTION OF THE DRAWINGS

FIG. 2A is a cross sectional diagram with regard to the semiconductor device according to the preferred embodiment of the present invention and for describing a case of having an overvoltage protection structure, while

FIG. 3A is a diagram with regard to the semiconductor device according to the preferred embodiment of the present invention and for describing a region in which an impact ionization generates in the case of having the overvoltage protection structure, while

DETAILED DESCRIPTION OF THE PREFERRED EMBODIMENTS

Figure 1:
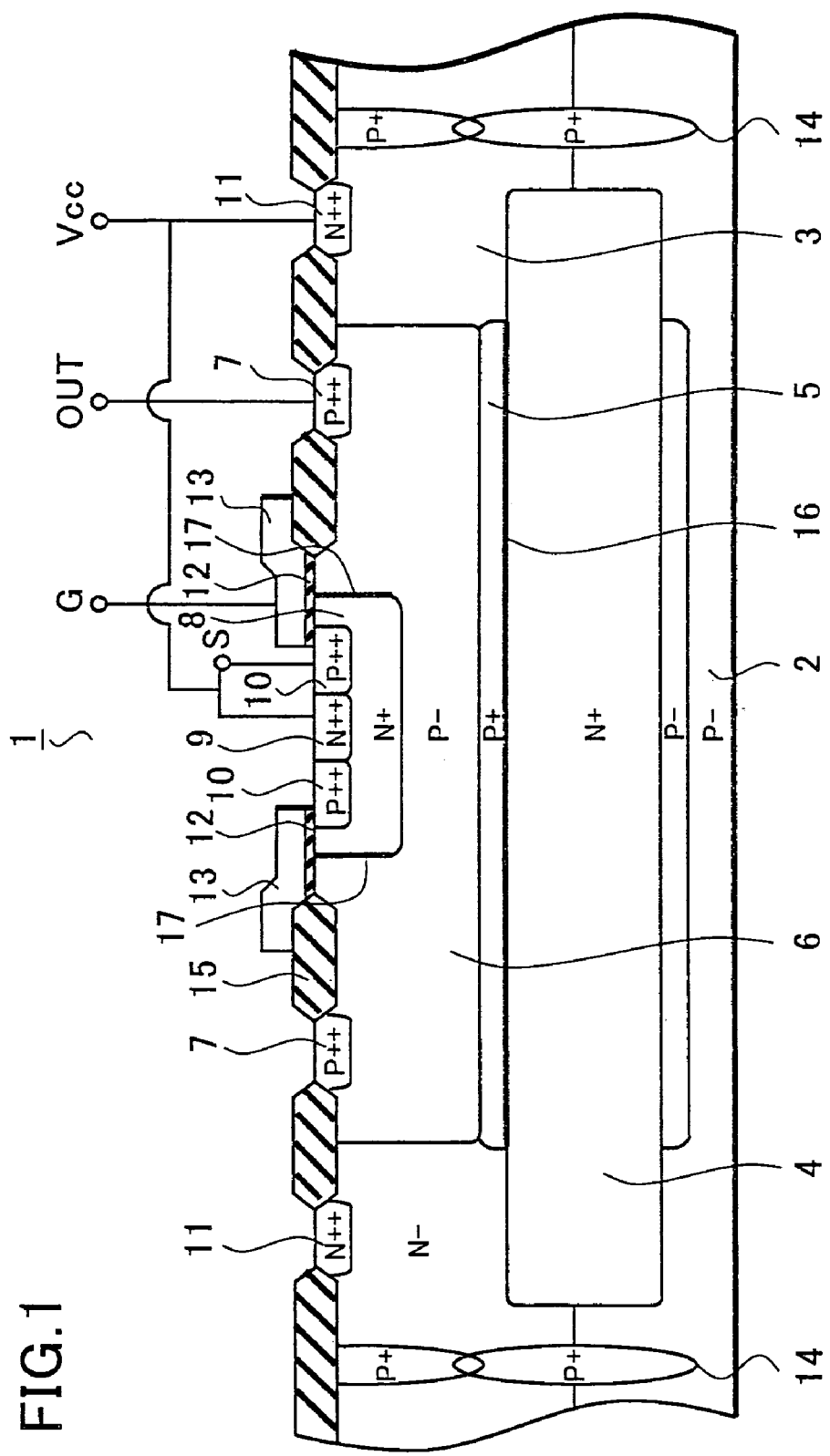
FIG. 1 is a cross sectional diagram for describing a semiconductor device according to a preferred embodiment of the present invention.
Figure 2A:
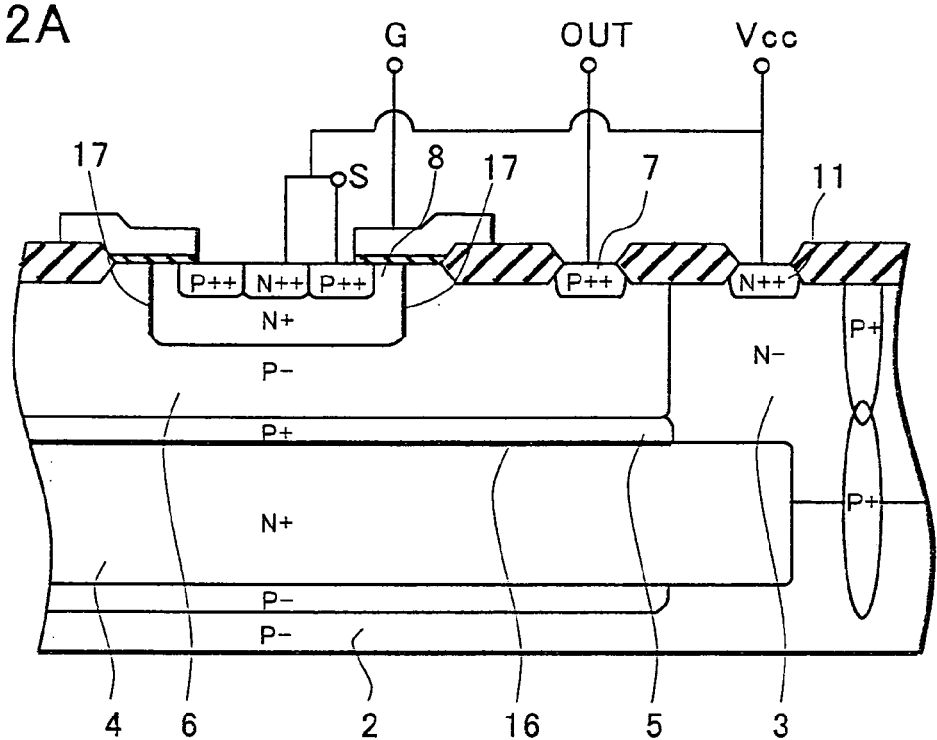
Figure 2B:
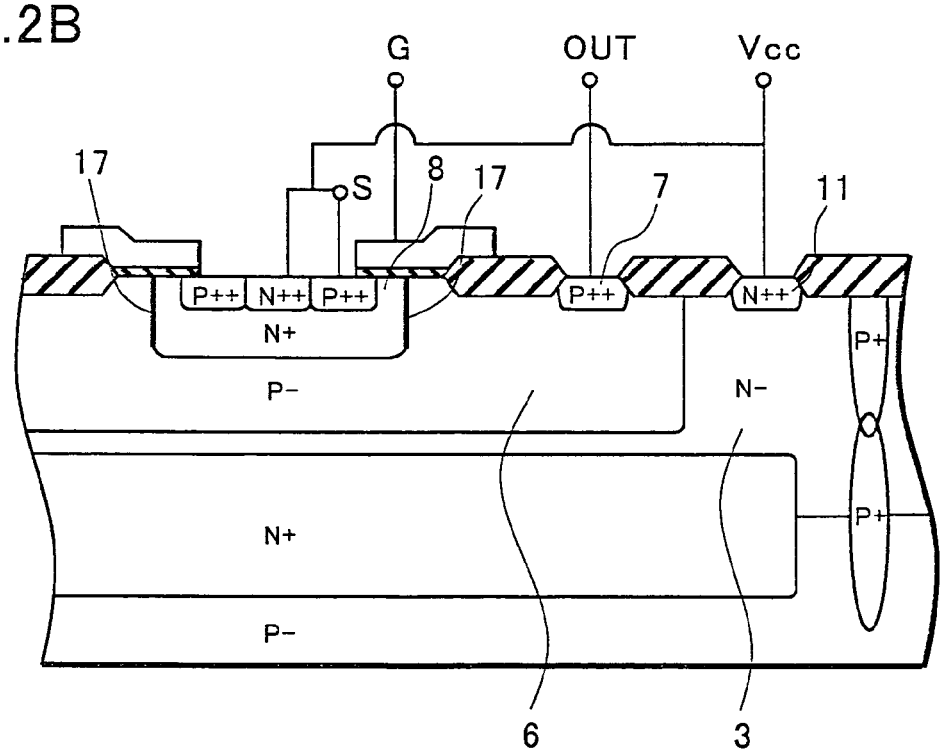
FIG. 2B is a cross sectional diagram with regard to the semiconductor device according to the preferred embodiment of the present invention and for describing a case of not having an overvoltage protection structure.
Figure 3A:
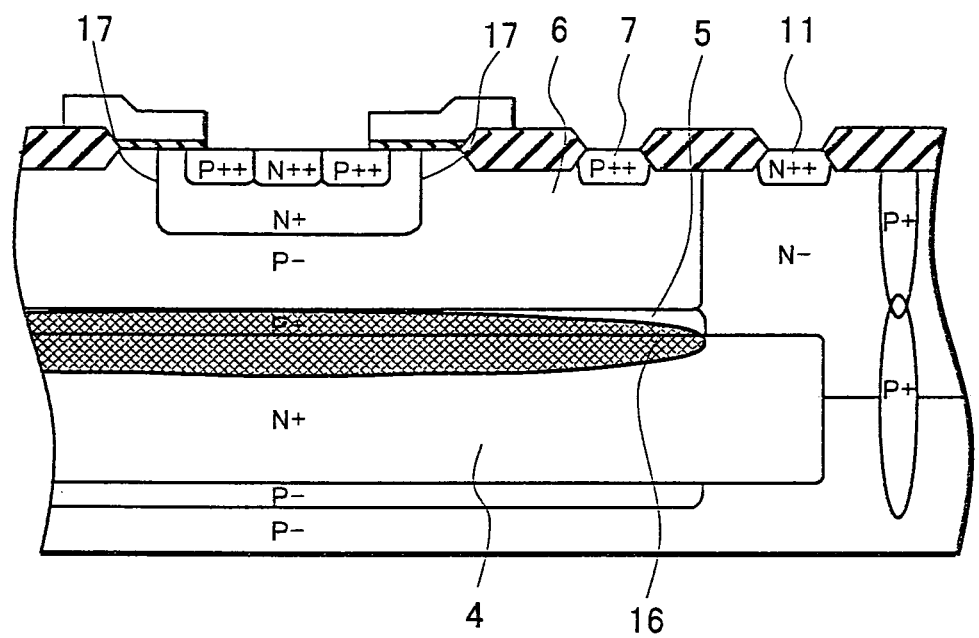
Figure 3B:
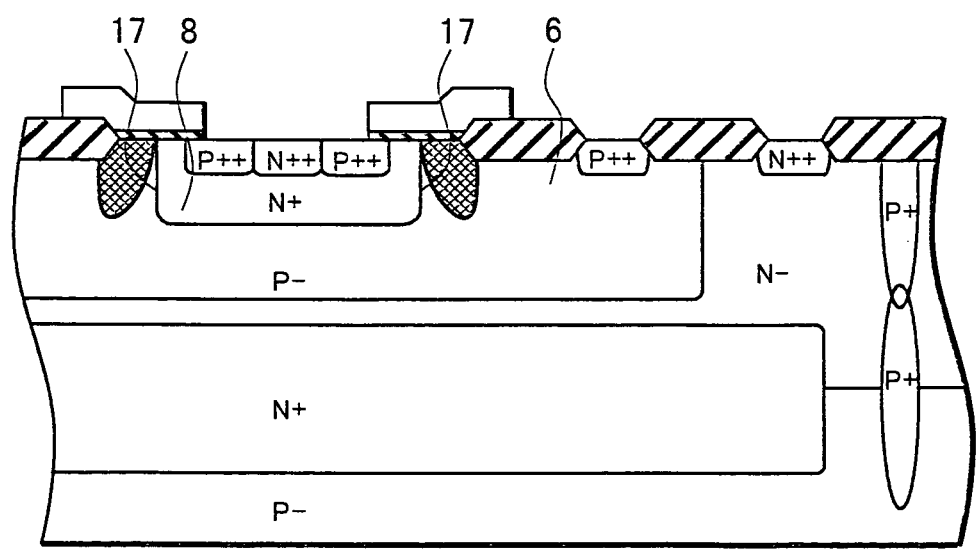
FIG. 3B is a diagram with regard to the semiconductor device according to the preferred embodiment of the present invention and for describing the region in which the impact ionization generates in the case of not having overvoltage protection structure.
Figure 4:
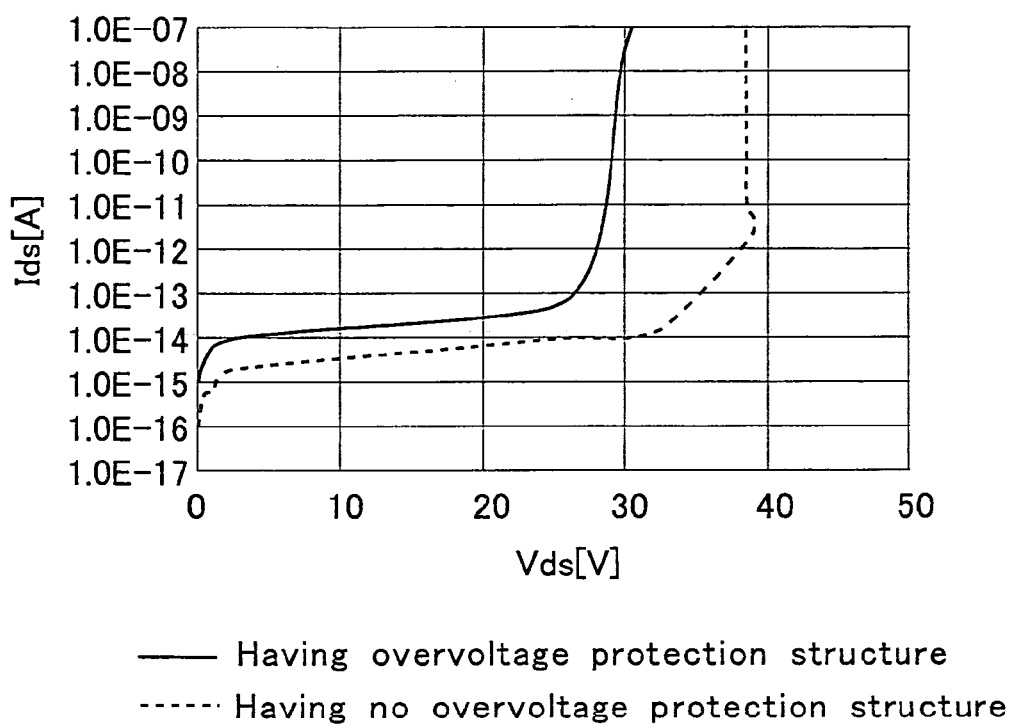
FIG. 4 is a graph for describing a relation between a current value between a source and a drain and a voltage value between the source and the drain of the semiconductor device in the preferred embodiment of the present invention.
Figure 5:
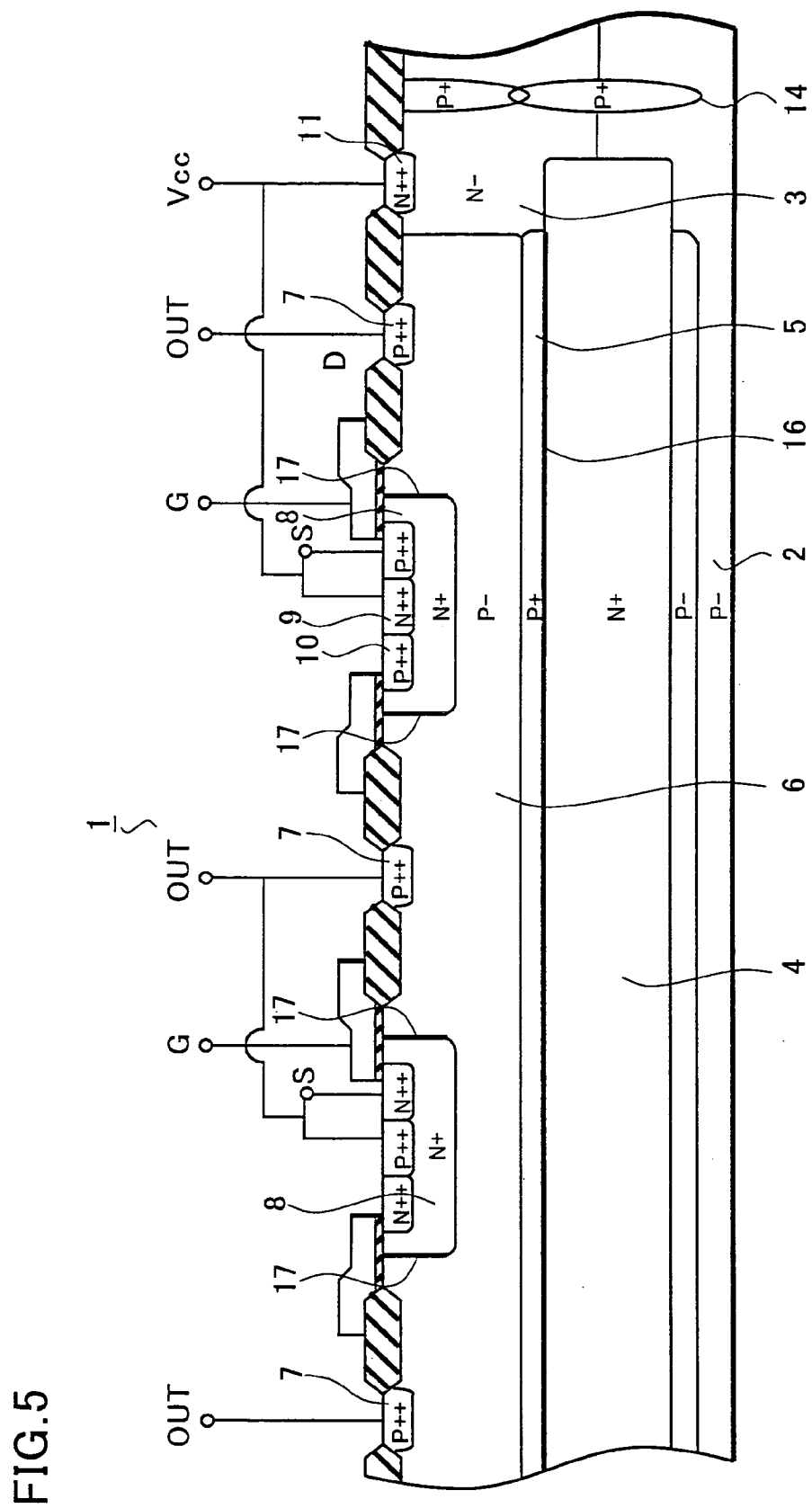
FIG. 5 is a cross sectional diagram for describing a semiconductor device according to a preferred embodiment of the present invention.

Detailed descriptions of a semiconductor device according to a preferred embodiment of the present invention will now be given below with reference to FIGS. 1 to 5. FIG. 1 is a cross sectional diagram for describing a semiconductor device according to the preferred embodiment. FIG. 2A is a cross sectional diagram of a semiconductor device having an overvoltage protection structure. FIG. 2B is a cross sectional diagram of a semiconductor device having no overvoltage protection structure. FIG. 3A is a diagram for describing a region in which an impact ionization generates in the semiconductor device having the overvoltage protection structure, and FIG. 3B is a diagram for describing the regions in which impact ionization generates in the semiconductor device having no overvoltage protection structure. FIG. 4 is a comparative diagram of element characteristics of the semiconductor device having the overvoltage protection structure and the semiconductor device having no overvoltage protection structure. FIG. 5 is a cross sectional diagram for describing a semiconductor device according to the preferred embodiment.

As shown in FIG. 1, a P-channel type LDMOS transistor 1 is mainly formed of a P-type single crystal silicon substrate 2, an N-type epitaxial layer 3, an N-type buried diffusion layer 4, a P-type buried diffusion layer 5, P-type diffusion layers 6 and 7 to be used as drain regions, N-type diffusion layers 8 and 9 to be used as back gate regions, P-type diffusion layers 10 to be used as source regions, N-type diffusion layers 11, a gate oxide film 12, and gate electrodes 13.

The N-type epitaxial layer 3 is deposited on an upper surface of the P-type single crystal silicon substrate 2. It should be noted that though a case where one layer of the epitaxial layer 3 is formed on the substrate 2 is shown in the present embodiment, it is not limited to this structure. For example, a plurality of epitaxial layers may be laminated on the substrate.

The N-type buried diffusion layer 4 is formed in both regions of the substrate 2 and the epitaxial layer 3. The N-type buried diffusion layer 4 is formed by diffusing a stibium (Sb), for example. As shown in FIG. 1, the N-type buried diffusion layer 4 is formed across a formation region of the LDMOS transistor 1 divided by isolation regions 14. It should be noted that the N-type buried diffusion layer 4 in the present embodiment corresponds to "a buried diffusion layer of an opposite conductivity type" of the present invention.

The P-type buried diffusion layers 5 are formed in the substrate 2 and the epitaxial layer 3 so as to be extended from upper and lower surfaces of the N-type buried diffusion layer 4. The P-type buried diffusion layer 5 is formed by diffusing a boric acid (B), for example. In addition, the P-type diffusion layer 5 may be formed so as to have an equal region on the upper surface of the N-type buried diffusion layer 4. Detailed descriptions will be given later, but a design of the formation region of the P-type buried diffusion layer 5 can be arbitrarily changed as long as it has a configuration in which a concentration of a breakdown current in a PN junction region between the N-type buried diffusion layer 4 and the P-type buried diffusion layer 5 can be prevented. It should be noted that in the present embodiment, though the boric acid (B) is used as a P-type impurity, the case is not limited to this. The P-type buried diffusion layer 5 has only to be extended from the upper surface of the N-type buried diffusion layer 4, and when a diffusion coefficient of the P-type impurity is greater than a diffusion coefficient of the N-type impurity, an arbitral design change is possible. In addition, the P-type buried diffusion layer 5 in the present embodiment corresponds to "a buried diffusion layer of one conductivity type" of the present invention.

The P-type diffusion layer 6 is formed in the epitaxial layer 3 so as to be connected to the P-type buried diffusion layer 5. In addition, in the P-type diffusion layer 6, the P-type diffusion layers 7 are formed. The P-type diffusion layers 6 and 7 are used as the drain regions and have a dual diffusion structure. In addition, by connecting the P-type diffusion layer 6 to the P-type buried diffusion layer 5, a drain potential can be applied to the P-type buried diffusion layer 5. With this structure, there is no need to form other diffusion layer for applying an electric potential to the P-type buried diffusion layer 5. It should be noted that the P-type diffusion layer 6 in the present embodiment corresponds to "a third diffusion layer of one conductivity type" of the present invention.

The P-type diffusion layer 7 is formed circularly so as to surround the N-type diffusion layer 8 and used as a drain lead-out region. Then, the P-type diffusion layer 7 is connected to an output pad with a wiring or the like above the epitaxial layer 3. In the present embodiment, the drain region is used as an output and an electric potential lower than an electric potential of a power supply is applied. It should be noted that the P-type diffusion layer 7 of the present embodiment corresponds to "a third diffusion layer of one conductivity type" of the present invention.

The N-type diffusion layers 8 and 9 are formed in the P-type diffusion layer 6. The N-type diffusion layer 8 is used as the back gate region and the N-type diffusion layer 9 is used as a back gate lead-out region. It should be noted that the N-type diffusion layer 8 in the present embodiment corresponds to "a second diffusion layer of an opposite conductivity type" of the present invention.

The P-type diffusion layers 10 are formed in the N-type diffusion layer 8. The P-type diffusion layers 10 are used as the source region. The P-type diffusion layers 10 are formed so as to surround the N-type diffusion layer 9. The N-type diffusion layer 8 positioned between the P-type diffusion layer 6 and the P-type diffusion layers 10 is used as a channel region. In addition, a source electrode is connected to the N-type diffusion layer 9 and P-type diffusion layers 10. That is, a back gate potential having the same potential as a source potential is applied to the N-type diffusion layer 9. It should be noted that in the present embodiment, the source potential and the back gate potential are power source potential. In addition, the P-type diffusion layer 10 of the present embodiment corresponds to "a second diffusion layer of one conductivity type" of the present invention.

The N-type diffusion layers 11 are formed in the epitaxial layer 3 between the P-type diffusion layer 6 and the P-type isolation regions 14. The N-type diffusion layers 11 are connected to the source electrode by a wiring or the like above the epitaxial layer 3. With this structure, the source potential is applied to the N-type diffusion layers 11. In addition, as shown in FIG. 1, the N-type buried diffusion layer 4 is formed below the N-type diffusion layers 11 with the N-type epitaxial layers 3 interposed therebetween. The source potential is applied to the buried diffusion layer 4 through the N-type diffusion layers 11. The N-type diffusion layers 11 of the present embodiment correspond to "a second diffusion layer of opposite conductivity type" of the present invention.

The gate oxide films 12 are formed on a surface of the epitaxial layer 3 in which the back gate region or the like is formed.

The gate electrodes 13 are formed on the gate oxide films 12. The gate electrodes 13 are formed of a polysilicon film, a tungsten silicon film or the like are formed to have a desired thickness.

Lastly, Local Oxidation of Silicon (LOCOS) oxide films 15 are formed in a desired region of the epitaxial layer 3. Although they are not shown in FIG. 1, insulating layers such as a Boron Phospho Silicate Glass (BPSG) film, a Spin On Glass (SOG) film or the like is formed on the surface of the epitaxial layer 3.

Next, as shown by a thick solid line, a PN junction region 16 between the N-type buried diffusion region 4 and the P-type buried diffusion layer 5 is formed below the region where the LDMOS transistor 1 is formed. As described above, the source potential is applied to the N-type buried diffusion layer 4 through the N-type diffusion layers 11 and the epitaxial layer 3. On the other hand, the drain potential is applied to the P-type buried diffusion layer 5 through the P-type diffusion layers 6 and 7. That is, a reverse bias is applied to the PN junction region 16, and it is in an open state when the LDMOS transistor 1 is in a normal operation. It should be noted that the PN junction region 16 of the present embodiment corresponds to "a first junction region" of the present invention.

In addition, as shown by thick solid lines, PN junction regions 17 between the N-type diffusion layer 8 and the P-type diffusion layer 6 are formed in the region where the LDMOS transistor 1 is formed. The drain potential is applied to the P-type diffusion layer 6 through the P-type diffusion layer 7. On the other hand, the back gate potential is applied to the N-type diffusion layer 8 through the N-type diffusion layer 9. That is, similarly to the PN junction region 16, a reverse bias is applied to the PN junction regions 17. It should be noted that the PN junction regions 17 in the present embodiment corresponds to "a second junction region" of the present invention.

With this structure, the reverse bias having the substantially same condition is applied to the PN junction region 16 and the PN junction regions 17. Then, for example, a positive overvoltage or the like that is generated at the time of an L-load turn off such as a motor load is applied through the source region between the source and the drain of the LDMOS transistor 1. In this case, the PN junction region 16 is caused to be broken down before the PN junction regions 17 are broken down so that the LDMOS transistor 1 can be prevented from being broken. The detailed descriptions will be given later, but in the present embodiment, an impurity concentration of the N-type buried diffusion layer 4 and the P-type buried diffusion layer 5 is determined such that the breakdown voltage of the PN junction region 16 is to be lower than the breakdown voltage of the PN junction regions 17 (the breakdown voltage between the source and the drain). That is, the P-type buried diffusion layer 5 having a high impurity concentration is formed on the upper surface of the N-type buried diffusion layer 4 so as to cause a region where a depletion layer expands to be narrowed.

It should be noted that even when a negative overvoltage is applied through the output pad to the drain region, the LDMOS transistor 1 can be similarly prevented from being broken. In addition, as shown in FIG. 1, the P-type buried diffusion layer 5 is also formed in the lower surface of the N-type buried diffusion layer 4 depending on the impurity concentration, the diffusion condition, or the like of the P-type buried diffusion layer 5. However, the impurity concentration of the P-type buried diffusion layer 5 positioned in the lower surface of the N-type buried diffusion layer 4 is low, and the breakdown voltage of a PN junction region positioned in the lower surface side of the N-type buried diffusion layer 4 becomes higher than the breakdown voltage of the PN junction regions 17.

Next, with reference to FIGS. 2 to 4, a case where an overvoltage is respectively applied to an LDMOS transistor having an overvoltage protection structure and an LDMOS transistor having no overvoltage protection structure will be described below.

FIG. 2A shows one region of the LDMOS transistor 1 shown in FIG. 1. As described above, the PN junction region 16 between the N-type buried diffusion layer 4 and the P-type buried diffusion layer 5 is formed. By having the PN junction region 16, an overvoltage protection structure is obtained. On the other hand, FIG. 2B shows the same structure except that the P-type buried diffusion layer 5 shown in FIG. 2A is not formed. That is, the structure shown in FIG. 2B does not have the PN junction region 16, and a breakdown voltage of a PN junction region between the N-type epitaxial layer 3 and the P-type diffusion layer 6 becomes higher than the breakdown voltage of the PN junction regions 17 due to the impurity concentration. Therefore, the overvoltage protection structure is not obtained. It should be noted that the same reference numerals shown in FIG. 1 are used to denote the same components shown in FIGS. 2A and 2B.

As shown in FIGS. 3A and 3B, impact ionizations shown by solid line and crosshatching are generated when the overvoltage is applied to the LDMOS transistor.

First, in the structure shown in FIG. 3A, the impact ionization occurs in the PN junction region 16 and the vicinity thereof and a maximum breakdown current flows. On the other hand, in the structure shown in FIG. 3B, the impact ionization occurs in the PN junction regions 17 between the N-type diffusion layer 8 and the P-type diffusion layer 6 and the vicinity thereof and the maximum breakdown current flows.

With this phenomenon, in the structure having no PN junction region 16 shown in FIG. 3B, the PN junction regions 17 between the source and the drain of the LDMOS transistor is broken down. Then, the generation of the breakdown current is concentrated in the vicinity of the surface of the PN junction regions 17. Therefore, the PN junction regions 17 are broken by the concentration of the breakdown current and a heat due to the concentration thereof, and the LDMOS transistor itself is broken.

On the other hand, in the structure having the PN junction region 16 shown in FIG. 3A, the PN junction region 16 is broken before the PN junction regions 17 are broken down. Then, the breakdown current is generated across the wider region in the PN junction region 16. With this structure, the concentration of the breakdown current in the PN junction region 16 is alleviated and the PN junction region 16 is hard to be broken by the breakdown current. Then, the generation of the maximum breakdown current in the PN junction regions 17 and the region in the vicinity thereof is suppressed, and it becomes possible that the LDMOS transistor itself has a structure which is hard to be broken.

That is, the N-type buried diffusion layer 4 is widely formed below the LDMOS transistor. Thus, even when the N-type buried diffusion layer 4 is widely formed, the above described overvoltage protection structure can be obtained without increasing the void region where the element are not disposed in an actual operational region.

In addition, as shown in FIG. 3A, in the structure having the PN junction region 16, the breakdown current flows to the P-type diffusion layer 6 side that is the drain region. In the present embodiment, the P-type buried diffusion layer 5 is formed so that the P-type buried diffusion layer 5 with high impurity concentration is extended from the upper surface of the N-type buried diffusion layer 4. With this structure, the breakdown current can be prevented from flowing from the N-type buried diffusion layer 4 to the substrate 2, and the breakdown current flows between the P-type diffusion layer 7 and the N-type diffusion layer 11 by using the PN junction region 16 as the current path. As a result, a displacement of a substrate potential due to the flow of the breakdown current, for example a rise of electric potential from the grounding state, can be prevented. Moreover, it can be prevented that elements commonly formed on the substrate 2 and formed in other regions are wrongly operated, and the latch up phenomenon occurs.

Specifically, in FIG. 4, a bearing voltage between a drain and source (BVds) of the LDMOS transistor is designed to be at 40V, and the solid line shows the case of having the overvoltage protection structure (see, FIG. 2A), and the dotted line shows the case of not having the overvoltage protection structure (see, FIG. 2B). In the structure shown by the solid line, a voltage of 30 V or greater is not applied between the source and the drain since the PN junction region 16 is designed to have a breakdown voltage of approximately 30V. On the other hand, in the structure shown by the dotted line, a voltage of approximately 38V is applied between the source and the drain, and the PN junction regions 17 are broken down. As described above, by having the PN junction region 16 as the overvoltage protection structure, the structure with which the LDMOS transistor becomes hard to be broken can be obtained even when the overvoltage is applied.

It should be noted that the design of the breakdown voltage of the PN junction region 16 can be arbitrarily changed by an adjustment of the impurity concentration of the N-type buried diffusion layer 4 and the P-type buried diffusion layer 5, a diffusion width of the N-type buried diffusion layer 4 and the P-type buried diffusion layer 5, or the like. When the breakdown voltage of the PN junction region 16 is set to be excessively small, a current capability of the LDMOS transistor may be deteriorated. Therefore, the breakdown voltage of the PN junction region 16 can be set within a desired range with consideration of the element characteristic.

As shown in FIG. 5, the present embodiment can be applied for a structure in which a drain lead-out region and a back gate region are alternately and repeatedly disposed. It should be noted that the same reference numerals in FIG. 1 are used to denote the same components in FIG. 5.

As described by referring to FIG. 1, an N-type epitaxial layer 3 is deposited on an upper surface of a P-type crystal silicon substrate 2. In the substrate 2 and the epitaxial layer 3, an N-type buried diffusion layer 4 is formed. A P-type buried diffusion layer 5 is formed in upper and lower surfaces of the N-type buried diffusion layer 4 so that a PN junction region 16 is formed. In the epitaxial layer 3, a P-type diffusion layer 6 is formed so as to be connected to the P-type buried diffusion layer 5. The P-type diffusion layer 6 is used as the drain region. Then, in the P-type diffusion layer 6, P-type diffusion layers 7 used as drain lead-out regions and N-type diffusion layers 8 used as back gate regions are alternately and repeatedly formed. In the N-type diffusion layers 8, an N-type diffusion layer 9 used as a back gate lead-out region and P-type diffusion layers 10 used as source regions are formed. With this structure, PN junction regions 17 between the N-type diffusion layer 8 and the P-type diffusion layer 6 are formed between the source and the drain. Then, in the epitaxial layer 3 between the P-type diffusion layer 6 and an isolation region 14, an N-type diffusion layer 11 to which a source potential is applied is formed.

In the present embodiment, even in the structure in which the drain lead-out region and the back gate region are repeatedly formed, the PN junction region 16 as an overvoltage protection structure can be formed. Moreover, the N-type buried diffusion layer 4 is integrally formed across a region divided by the isolation regions 14. That is, the N-type buried diffusion layer 4 can be effectively disposed in an element forming region. Therefore, a breaking of the PN junction region 16 is prevented while a breaking of the LDMOS transistor can be also prevented. In particular, when the N-type buried diffusion layer 4 is formed in the wide element forming region like the structure in which the drain lead-out region and the back gate region are alternately and repeatedly disposed, the structure becomes such that the breaking of the PN junction region 16 is hard to occur.

In addition, in the present embodiment, the description has been given by using the structure in which the P-type buried diffusion layer 5 is integrally formed on the upper surface of the N-type buried diffusion layer 4, but the structure is not limited to this. For example, a plurality of the P-type buried diffusion layers 5 may be formed on the upper surface of the N-type buried diffusion layer 4. In this case, in each of the PN junction regions, a junction region which prevents a concentration of a breakdown current is needed.

It should be noted that in the present embodiment, the description has been given of a case where the P-type diffusion layer used as the drain region is connected to the P-type buried diffusion layer, but the case is not limited to this. For example, a PN junction region which is an overvoltage protection structure can be also formed by forming a diffusion layer which applies an electric potential to a P-type buried diffusion layer. In addition, various modifications can be made in a range without departing from the scope and spirit of the present invention.

Next, a method for manufacturing a semiconductor device according to the preferred embodiments will be described in detail with reference to FIGS. 6 to 11. It should be noted that in the following descriptions, the same reference numerals described in the semiconductor device shown in FIG. 1 are used to denote the same components.

FIGS. 6 to 11 are cross sectional diagrams for describing a method for manufacturing a semiconductor device in the present embodiments. It should be noted that in the following, descriptions will be given with reference to a case where, for example, a P-type channel MOS transistor is formed in one element forming region divided by isolation regions, but the case is not limited to this. For example, an N-type channel MOS transistor, an NPN type transistor, a vertical PNP transistor, or the like may be formed in other element forming region to form a semiconductor integrated circuit device.

Figure 6:
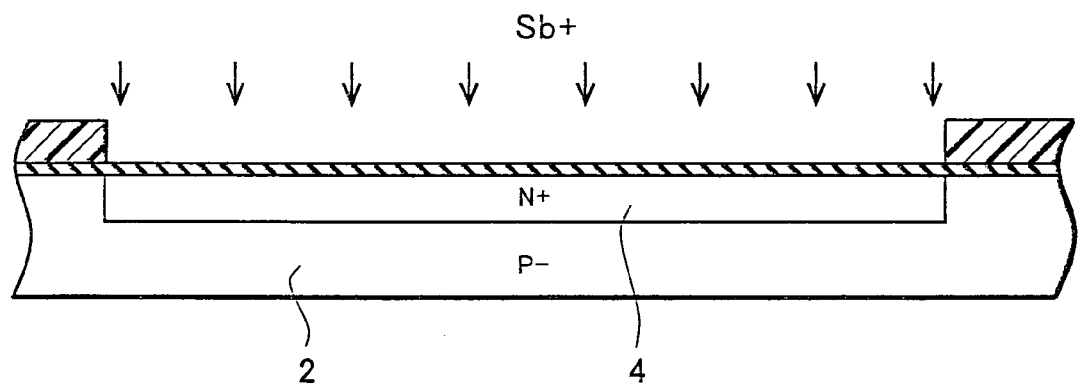
FIG. 6 is a cross sectional diagram for describing a method for manufacturing the semiconductor device according to the preferred embodiments of the present invention.

First, as shown in FIG. 6, a P-type crystal silicon substrate 2 is prepared. N-type impurities, for example an antimony (Sb), are ion implanted from a surface of the substrate 2 into a region where an N-type buried diffusion layer 4 is formed by using a well-known photolithographic technique. Then, after removing photoresist, the ion-implanted impurities are diffused.

Figure 7:
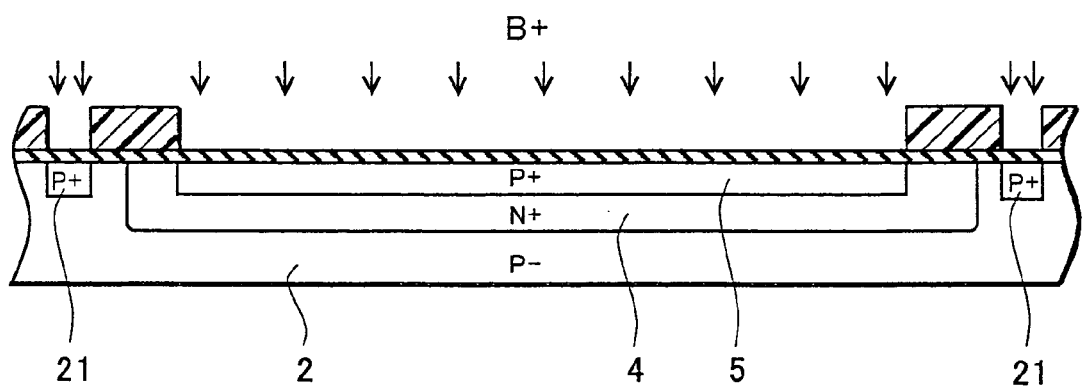
FIG. 7 is a cross sectional diagram for describing a method for manufacturing the semiconductor device according to the preferred embodiment of the present invention.

Next, as shown in FIG. 7, P-type impurities, for example, a boric acid (B), are ion implanted from the surface of the substrate 2 into a region where a P-type buried diffusion region 5 and buried diffusion layers 21 of isolation regions 14 are formed by using the well-known photolithographic technique. Then, after removing photoresist, the ion-implanted impurities are diffused.

Figure 8:
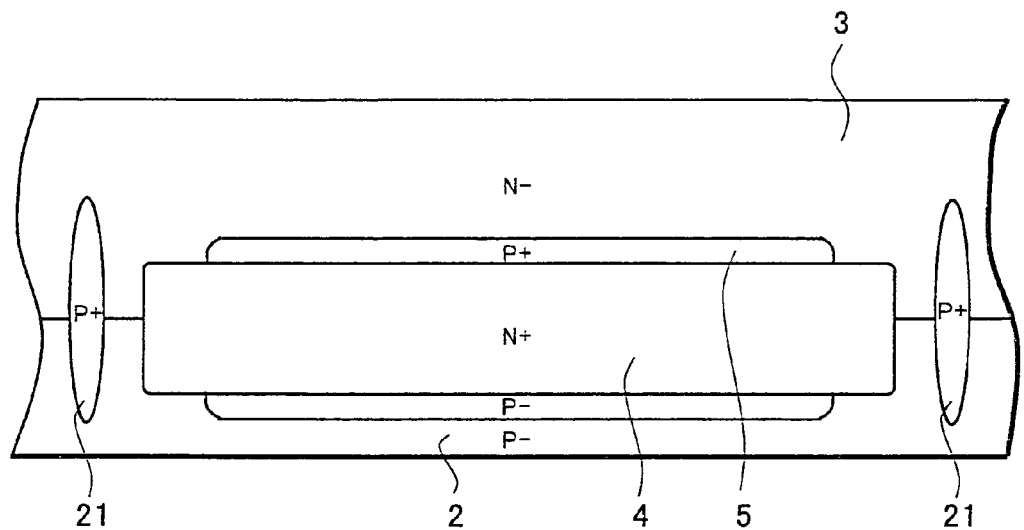
FIG. 8 is a cross sectional diagram for describing a method for manufacturing the semiconductor device according to the preferred embodiment of the present invention.

Next, as shown in FIG. 8, the substrate 2 is disposed on a susceptance of an epitaxial growth device. Then, the substrate 2 is given of a high temperature of, for example approximately 1200° C. by a lamp heating, and at the same time $SiHCl_3$ gas and $H_2$ gas are introduced into a reaction tube. With this process, an epitaxial layer 3 having a resistivity of 0.1 to 2.0 Ωcm and a thickness of 0.5 to 1.5 μm is grown. With this process, the N-type buried diffusion layer 4, the P-type buried diffusion layer 5 and the P-type buried diffusion layers 21 are diffused into the epitaxial layer 3. In addition, since the boric acid (B) has larger diffusion coefficient than the antimony (Sb), the P-type buried diffusion layer 5 is extended from the upper and lower surfaces of the N-type buried diffusion layer 4.

Figure 9:
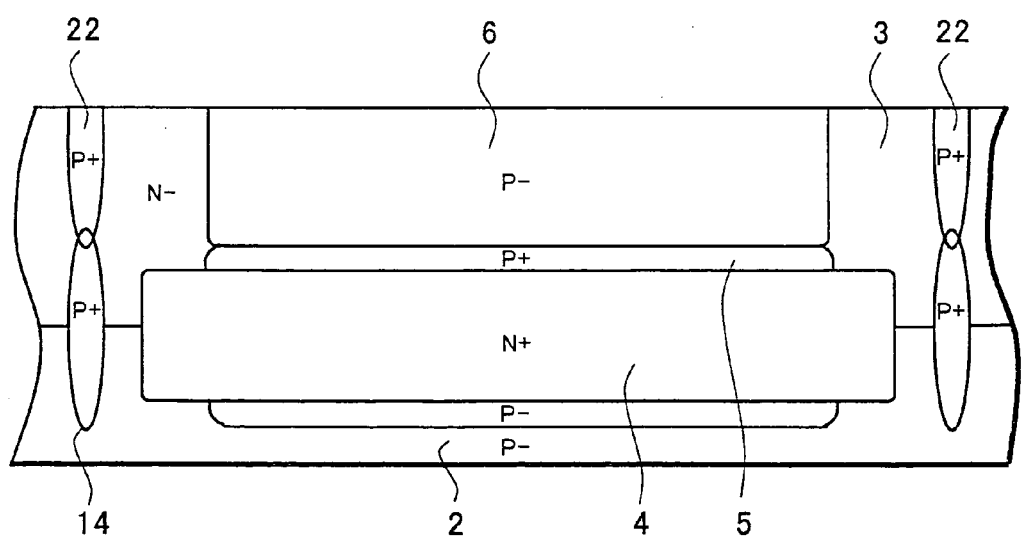
FIG. 9 is a cross sectional diagram for describing a method for manufacturing the semiconductor device according to the preferred embodiment of the present invention.

Next, as shown in FIG. 9, diffusion layers 22 of the P-type diffusion layer 6 and the isolation regions 14 are formed from the surface of the epitaxial layer 3 by using the well-known photolithographic technique. In this process, the P-type diffusion layer 6 is formed so as to be connected to the P-type buried diffusion layer 5.

Figure 10:
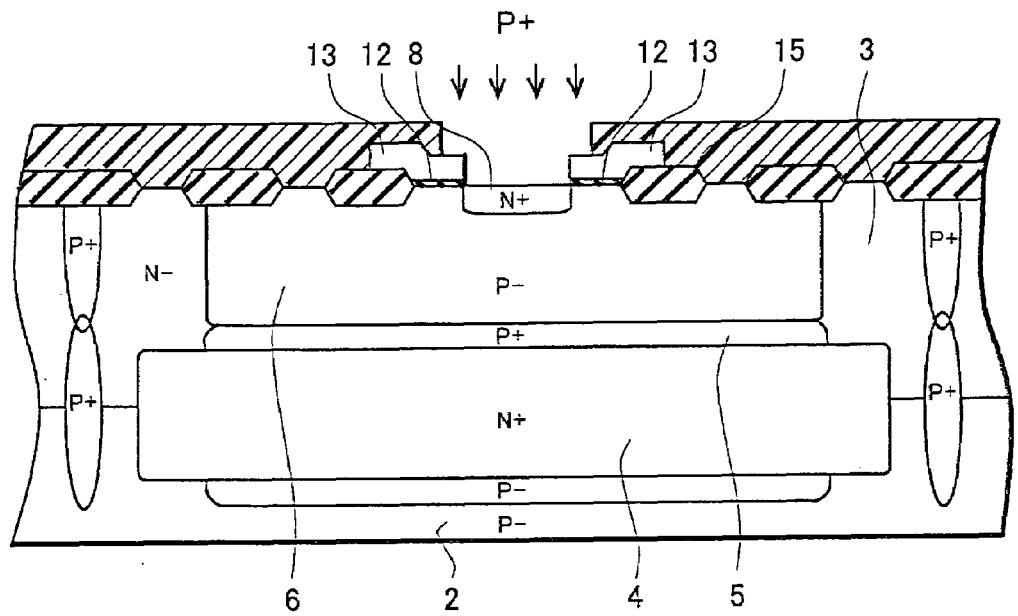
FIG. 10 is a cross sectional diagram for describing a method for manufacturing the semiconductor device according to the preferred embodiment of the present invention.

Next, as shown in FIG. 10, a heat treatment is carried out in the entire substrate 2 so that LOCOS oxide films 15 are formed in a desired region in the epitaxial layer 3. Then, a silicon oxide film, a polysilicon film, and a tungsten silicon film are deposited on the surface of the epitaxial layer 3. The silicon oxide film, the polysilicon film, and the tungsten silicon film are selectively removed by using the well-known photolithographic technique so that a gate oxide film 12 and gate electrodes 13 are formed.

After that, N-type impurities, for example a phosphorus (P), are ion implanted from the surface of the epitaxial layer 3 into a region where an N-type diffusion layer 8 is formed by using the well-known photolithographic technique. Then, after removing photoresist, the ion-implanted impurities are diffused. In this process, one end side of the gate electrodes 13 are used so that the N-type diffusion layer is formed by a self-alignment technique.

Figure 11:
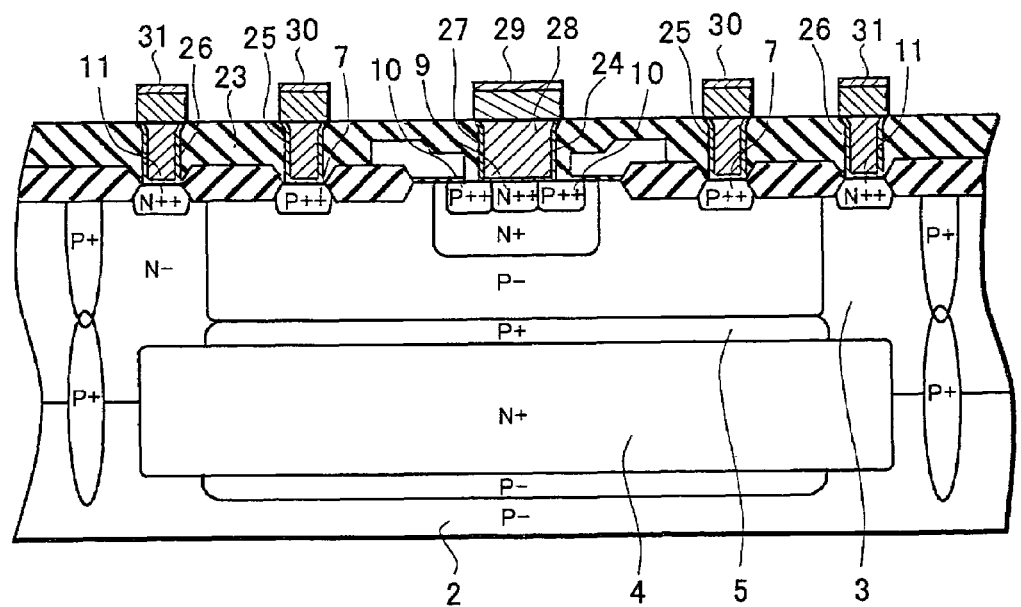
FIG. 11 is a cross sectional diagram for describing a method for manufacturing the semiconductor device according to the preferred embodiment of the present invention.

Lastly, as shown in FIG. 11, N-type diffusion layers 9 and 11 and P-type diffusion layers 7 and 10 are formed from the surface of the epitaxial layer 3 by using the well-known photolithographic technique. After that, for example, a boron-doped phospho-silicate glass (BPSG) film, a spin-on-glass (SOG) film or the like are deposited on the epitaxial layer 3 as an insulating layer 23. Then, contact holes 24, 25, and 26 are formed in the insulating layer 23 by a dry etching using, for example $CHF_3+O_2$ gas, by using the well-known photolithographic technique.

Next, a barrier metal film 27 is formed in inner walls or the like of the contact holes 24, 25, and 26. After that, the inside of the contact holes 24, 25, and 26 are buried by a tungsten (W) film 28. Then, an aluminum and copper (AlCu) film and the barrier metal film are deposited on an upper surface of the tungsten (W) film 28 by a chemical vapor deposition (CVD) method. After that, the AlCu film and the barrier metal film are selectively removed by using the well-known photolithographic technique so that a source electrode 29 and drain electrodes 30 are formed. It should be noted that a wiring layer to the gate electrodes 13 are not shown in the cross sectional diagram shown in FIG. 11, but the gate electrodes 13 are connected to the wiring layer in other region. In addition, it is not shown, but electrodes 31 formed on the N-type diffusion layer 11 are electrically connected so as to have the same electric potential with the source electrode 29.

As described above, in the present embodiment, a condition under which the PN junction region 16 is formed on the upper surface of the N-type buried diffusion layer 4 determines a condition under which the P-type buried diffusion layer 5 is formed. With this manufacturing method, a structure can be obtained so that a breakdown current is prevented from flowing to the substrate when the overvoltage is applied to an LDMOS transistor 1. In addition, it can be prevented that other element formed on the same substrate is wrongly operated due to the rise of substrate potential or occurrence of the latch up phenomenon.

In addition, the P-type buried diffusion layer 5 forming the PN junction region 16 can be formed by the common process for forming the buried diffusion layers 21 of the isolation regions 14. Therefore, a mask for forming the PN junction region 16, or the like is not needed, resulting in a prevention of increasing manufacturing costs.

In the preferred embodiments of the present invention, an N-type buried diffusion layer and a P-type buried diffusion layer are overlapped below a region where an element such as a MOS transistor is formed to form a PN junction region for element protection. The PN junction region is formed so that a breakdown voltage thereof is lower than a breakdown voltage between a drain and a source. With this structure, it is possible to prevent the MOS transistor from being broken by an overvoltage of the MOS transistor.

In addition, in the preferred embodiments of the present invention, the PN junction region is formed across a wider region on a surface of the N-type buried diffusion layer for element protection. With this structure, a breakdown current is diffused in the PN junction region so that the PN junction region can be prevented from being broken.

Moreover, in the preferred embodiment of the present invention, the PN junction region is formed on the surface of the N-type buried diffusion layer formed across a semiconductor substrate and an epitaxial layer. With this structure, the breakdown current does not flow on the semiconductor substrate and a change of electric potential of the semiconductor substrate caused by the breakdown current can be prevented.

Furthermore, in the preferred embodiments of the present invention, a drain potential is applied to the P-type buried diffusion layer forming the PN junction region for element protection by connecting the P-type buried diffusion layer to a P-type diffusion layer. With this structure, the P-type diffusion layer is not needed to be formed for applying an electric potential to the P-type buried diffusion layer and an element size can be minimized.

Still furthermore, in the preferred embodiments of the present invention, a source potential is applied to the N-type buried diffusion layer forming the PN junction region for element protection and the drain potential is applied to the P-type buried diffusion layer. With this structure, a current path for the breakdown current and a current path between the source and drain regions can be spaced apart. Then, the current path for the element is protected so that a deterioration of an element characteristic can be prevented.

What is claimed is:

1. A semiconductor device, comprising:
    a semiconductor substrate of one conductivity type;
    an epitaxial layer of an opposite conductivity type formed on the semiconductor substrate;
    a buried diffusion layer of an opposite conductivity type formed across the semiconductor substrate and the epitaxial layer;
    a buried diffusion layer of one conductivity type formed on the buried diffusion layer of the opposite conductivity type and having a first junction region with the buried diffusion layer of the opposite conductivity type;
    a first diffusion layer of one conductivity type formed in the epitaxial layer and used as a drain region;
    a first diffusion layer of an opposite conductivity type formed in the first diffusion layer of the one conductivity type and used as a back gate region as well as having a second junction region with the first diffusion layer of the one conductivity type;
    a second diffusion layer of one conductivity type formed in the first diffusion layer of the opposite conductivity type and used as a source region;
    a gate oxide film and a gate electrode formed on the epitaxial layer; and a second diffusion layer of an opposite conductivity type formed in the epitaxial layer and electrically connected to the second diffusion layer of the one conductivity type above the epitaxial layer,
    wherein a breakdown voltage of the first junction region is lower than a breakdown voltage of the second junction region.

2. A semiconductor device according to claim 1, wherein the first diffusion layer of the one conductivity type is connected to the buried diffusion layer of the one conductivity type.

3. A semiconductor device according to claim 2, wherein a third diffusion layer of one conductivity type used as a drain lead-out region is formed in the first diffusion layer of the one conductivity type, and the third diffusion layer of the one conductivity type and the first diffusion layer of the opposite conductivity type are alternately and repeatedly disposed in the first diffusion layer of the one conductivity type.

* * * * *